United States Patent
Horio et al.

(10) Patent No.: US 6,590,152 B1
(45) Date of Patent: Jul. 8, 2003

(54) ELECTROMAGNETIC SHIELD CAP AND INFRARED DATA COMMUNICATION MODULE

(75) Inventors: Tomoharu Horio, Kyoto (JP); Shigehiro Murakawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/645,523

(22) Filed: Aug. 25, 2000

(30) Foreign Application Priority Data

Aug. 26, 1999 (JP) .......................................... 11-239869
Aug. 30, 1999 (JP) .......................................... 11-242882
Nov. 30, 1999 (JP) .......................................... 11-339540

(51) Int. Cl.[7] ............................................. H05K 9/00
(52) U.S. Cl. ........................... 174/35 GC; 174/35 R; 257/659; 257/680; 257/432; 257/433; 257/434; 361/816
(58) Field of Search .................... 174/35 R, 35 MS, 174/35 GC; 361/816, 818; 257/659, 660, 680, 433, 434, 432

(56) References Cited

U.S. PATENT DOCUMENTS

| | | | | |
|---|---|---|---|---|
| 5,118,924 A | * | 6/1992 | Mehra et al. ............... | 250/211 |
| 5,355,016 A | * | 10/1994 | Swirbel et al. ............. | 257/659 |
| 5,406,117 A | * | 4/1995 | Dlugokecki et al. ........ | 257/659 |
| 5,485,037 A | * | 1/1996 | Marrs ......................... | 257/712 |
| 5,557,142 A | * | 9/1996 | Gilmore et al. ............. | 257/659 |
| 5,559,306 A | * | 9/1996 | Mahulikar .................. | 174/52.4 |
| 5,594,204 A | * | 1/1997 | Taylor et al. ............... | 174/52.2 |
| 5,679,975 A | * | 10/1997 | Wyland et al. ............. | 257/659 |
| 5,825,042 A | * | 10/1998 | Strobel et al. ............. | 250/515.1 |

FOREIGN PATENT DOCUMENTS

| JP | 11-68171 | 3/1999 | ........... H01L/33/00 |
|---|---|---|---|
| WO | WO 94 27421 | 11/1994 | ........... H05K/9/00 |

OTHER PUBLICATIONS

Copy of German Search Report.
English Abstract of JP-A-11-68171.

* cited by examiner

Primary Examiner—Hung V. Ngo
(74) Attorney, Agent, or Firm—Michael D. Bednarek; Shaw Pittman LLP

(57) ABSTRACT

An electromagnetic shield cap (3) includes a projection (34) which is pressed against an electronic component (1) with an elastic force when the cap is mounted to the electronic component (1). Since the projection (34) is pressed against the electronic component (1), the electromagnetic shield cap (3) is prevented from being detached from the electronic component (1). Therefore, it is possible to eliminate the necessity for bonding the electromagnetic shield cap (3) to the electronic component (1) with an adhesive.

11 Claims, 9 Drawing Sheets

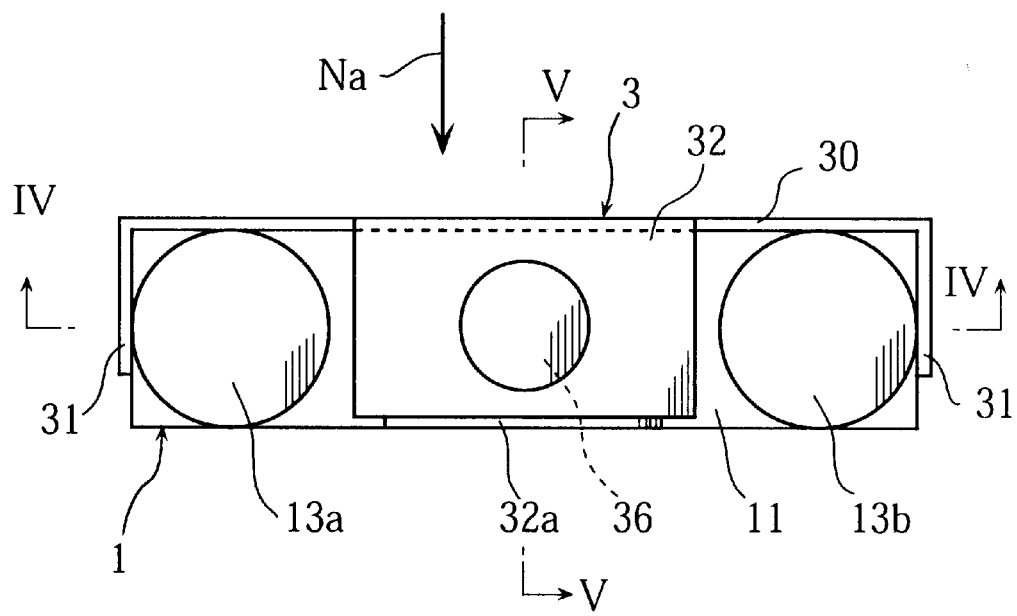
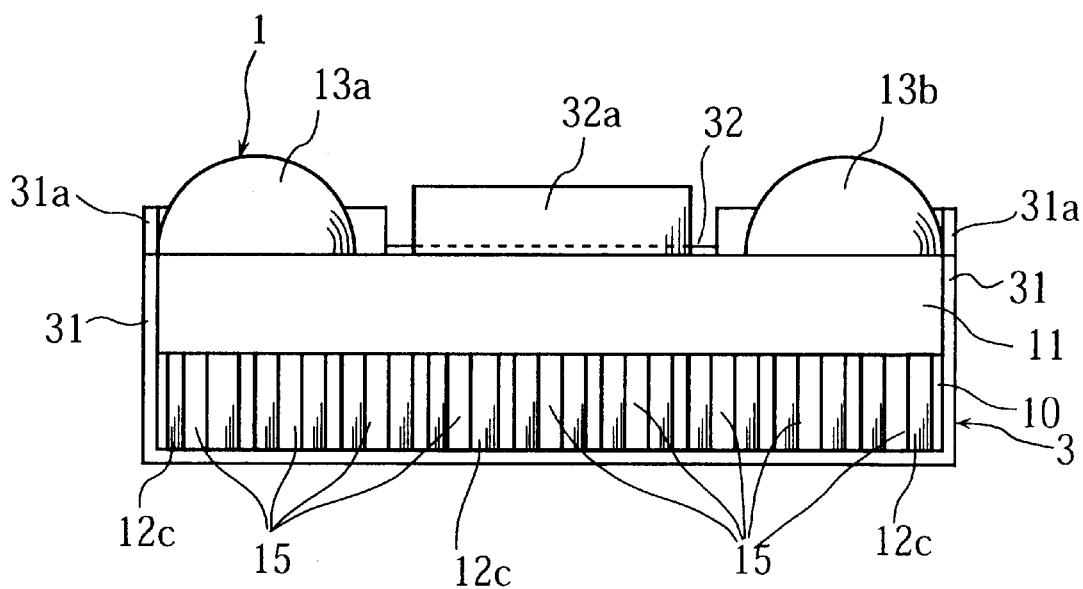

FIG.16
FIG.17
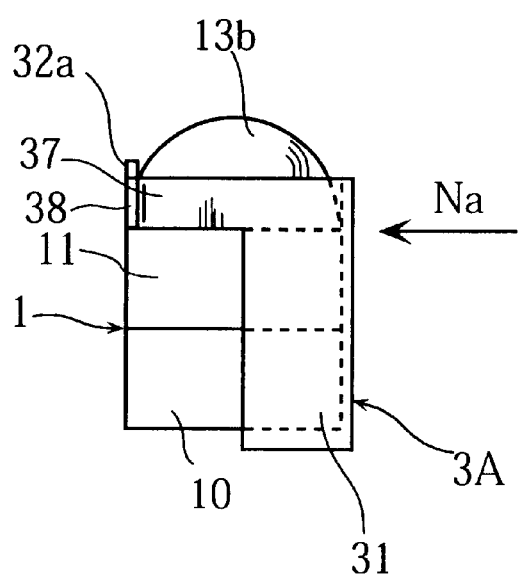
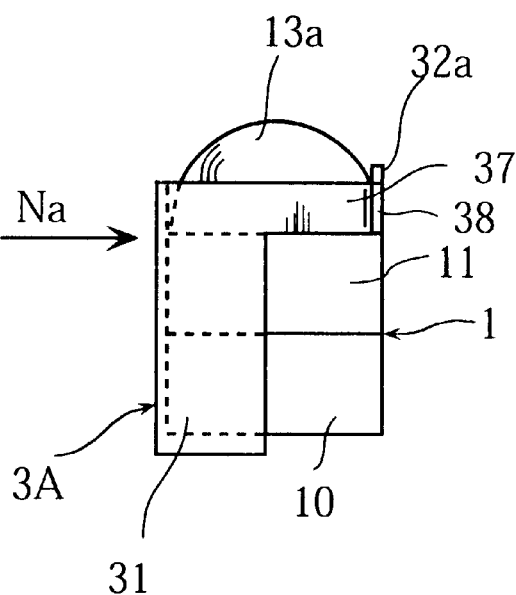
FIG.18
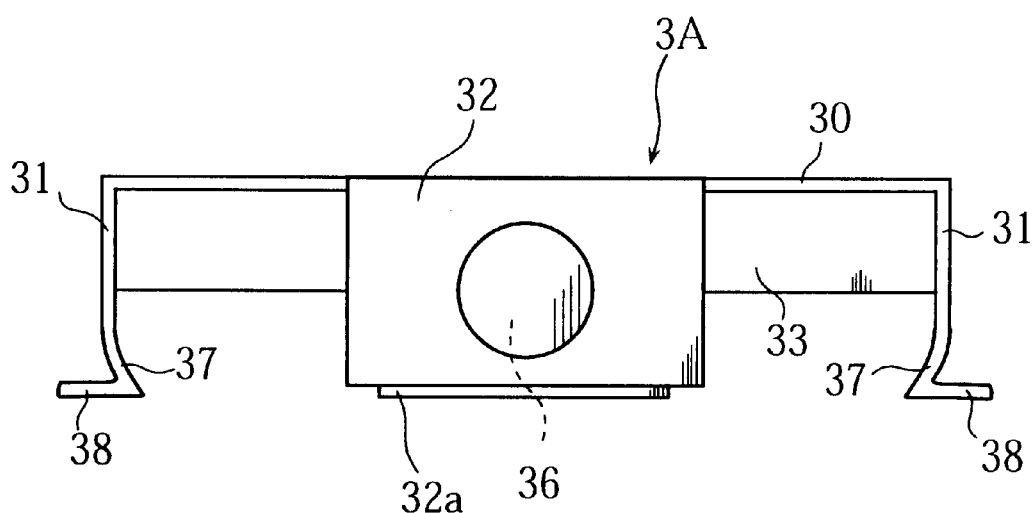

ELECTROMAGNETIC SHIELD CAP AND INFRARED DATA COMMUNICATION MODULE

TECHNICAL FIELD

The present invention relates to an electromagnetic shield cap for electromagnetically shielding an electronic component. It also relates to an infrared data communication module to which such an electromagnetic shield cap is mounted.

BACKGROUND ART

An electronic component such as an infrared data communication module often needs to be electromagnetically shielded for avoiding the influences of external noises. In the case where a substrate carrying an electronic component is housed in a relatively larger metal casing, an electromagnetic shield need not necessarily be separately provided for the electronic component because the casing serves as a electromagnetic shield.

Recently, however, there is an increasing demand for portable apparatus such as a mobile phone, in which a large metal casing is not employed to realize weight reduction. In such a case, conventionally, a cap formed by press-working a thin metal plate into a size substantially equal to that of the electronic component is mounted to the electronic component for electromagnetic shielding. However, the cap may come off if it is simply fitted over the electronic component. In the prior art, therefore, the cap is bonded to the electronic component with an adhesive.

However, the use of an adhesive increases the cost. Further, in mounting the cap to the electronic component, a step for applying an adhesive is additionally required. As a result, there are problems such as a reduced productivity and an increased cost in manufacturing the electronic component provided with the cap.

DISCLOSURE OF THE INVENTION

An object of the present invention is to provide an electromagnetic shield cap which is capable of eliminating or lessening the problems described above. Another object of the present invention is to provide an infrared data communication module provided with such a cap.

In accordance with a first aspect of the present invention, there is provided an electromagnetic shield cap to be mounted on an electronic component for electromagnetically shielding the electronic component. The electronic component includes a semiconductor chip and a seal body made of resin for sealing the semiconductor chip, wherein the electromagnetic shield cap has a projection for elastically pressing against the electronic component when the cap is mounted to the electronic component.

When the electromagnetic shield cap having the above structure is mounted to the electronic component, the projection is pressed against the electronic component. Due to such pressing action, the electromagnetic shield cap is prevented from easily coming off the electronic component. Therefore, in mounting the electromagnetic shield cap to the electronic component, a step for applying an adhesive is not necessary. As a result, it is possible to increase productivity and reduce the cost in manufacturing an electronic component provided with an electromagnetic shield cap.

Preferably, the electromagnetic shield cap may have a wall for facing the electronic component, and the projection may be formed by forming a cut on the wall and partially bending the wall in a rising manner.

According to this structure, it is possible to easily form a projection without increasing the overall size of the electromagnetic shield cap. Further, an elastic force is readily provided for the projection.

Preferably, the cap is fitted to the electronic component from a front side to a back side of the cap, and the projection may be inclined to project to a greater degree as it extends from the front side toward the back side.

With such a structure, in mounting the electromagnetic shield cap to the electronic component, the projection does not bite the cap in fitting to the electronic component. Therefore, it is possible to mount the electromagnetic shield cap smoothly.

Preferably, the projection may have a tip which is directed oppositely to the cap fitting direction.

With such a structure, when a force is exerted to detach the electromagnetic shield cap from the electronic component, great frictional resistance is generated between the tip of the projection and an outer surface of the electronic component. In the case where the electronic component has a relatively soft outer surface at a portion at which the tip of the projection engages, the tip of the projection can bite into the outer surface of the electronic component. As a result, the electromagnetic shield cap is more reliably prevented from coming off.

Preferably, the electromagnetic shield cap may have a pair of side walls spaced in facing relationship with each other for interposing the electronic component therebetween, and each of the side walls may be provided with the projection.

With such a structure, it is possible to interpose the electronic component between the paired side walls, or between the pair of projections provided on the side walls. Therefore, it is possible to suitably prevent the electromagnetic shield cap from being detached.

In accordance with a second aspect of the present invention, there is provided an infrared data communication module having a substrate, an infrared light emitting element mounted on the substrate, an infrared light receiving element mounted on the substrate, and a seal body made of resin for sealing the light emitting element and the light receiving element. The infrared data communication module is provided with a cap for electromagnetic shielding, wherein the electromagnetic shield cap is provided with a projection for pressing against at least one of the substrate and the seal body.

The infrared data communication module having such a structure has the same advantages as those described for the electromagnetic shield cap according to the first aspect of the present invention.

In accordance with a third aspect of the present invention, there is provided an electromagnetic shield cap to be mounted on an electronic component for electromagnetically shielding the electronic component. The electronic component includes a semiconductor chip and a seal body made of resin for sealing the semiconductor chip. The seal body is formed with a recess impressed by an ejector pin attached to a mold for forming the seal body. The electromagnetic shield cap has a bulging portion for fitting into the recess when the cap is mounted to the electronic component.

When the electromagnetic shield cap having such a structure is mounted to the electronic component, the bulging portion fits into the recess. Due to such fitting, the electromagnetic shield cap is prevented from being easily detached from the electronic component. Therefore, in mounting the electromagnetic shield cap to the electronic component, a step for applying an adhesive is not necessary, which leads to an increased productivity and cost reduction. Since the recess is impressed by the ejector pin used in molding the seal body, the shape of the mold for forming the seal body needs not to be specially designed.

Preferably, the electromagnetic shield cap may have a wall for facing the seal body, and the bulging portion may be formed by press-working the wall.

According to such a structure, the bulging portion can be easily provided.

Preferably, the bulging portion may be tapered with a hem extending obliquely from a flat portion around the bulging portion.

With such a structure, the bulging portion does not become a great hindrance in mounting the electromagnetic shield cap to the electronic component, so that fitting of the electromagnetic shield cap can be performed easily. Further, since the bulging portion is tapered, it is easily fitted into the recess.

Preferably, the electromagnetic shield cap may further comprise a projection for pressing against the electronic component when the cap is mounted to the electronic component.

With such a structure, the electromagnetic shield cap is more reliably prevented from coming off the electronic component.

In accordance with a fourth aspect of the present invention, there is provided an infrared data communication module including an infrared light emitting element, an infrared light receiving element, and a seal body made of resin for sealing the light emitting element and the light receiving element. The seal body is formed with a recess impressed by an ejector pin attached to a mold for forming the seal body. The infrared data communication module is provided with a cap for electromagnetic shielding, wherein the electromagnetic shield cap includes a bulging portion for fitting into the recess.

The infrared data communication module having such a structure has the same advantages as those described for the electromagnetic shield cap according to the third aspect of the present invention.

In accordance with a fifth aspect of the present invention, there is provided an electromagnetic shield cap to be mounted on an electronic component for electromagnetically shielding the electronic component. The electronic component includes a semiconductor chip, a seal body made of resin for sealing the semiconductor chip, and a convex lens provided at the seal body. The electromagnetic shield cap includes an engaging portion for engaging the lens in such a manner as to embrace the lens when the cap is mounted to the electronic component.

When the electromagnetic shield cap having such a structure is mounted to the electronic component, the engaging portion engages the lens. Due to such engagement, the electromagnetic shield cap is prevented from being easily detached from the electronic component. Thus, it is possible to positively fit the electromagnetic shield cap to the electronic component without using an adhesive.

Preferably, the engaging portion may be so configured as to engage an outer periphery of a base portion of the lens.

With such a structure, the engaging portion does not cover a large area of the outer surface of the lens.

In accordance with a sixth aspect of the present invention, there is provided an infrared data communication module having an infrared light emitting element, an infrared light receiving element, a seal body made of a resin for sealing the light emitting element and the light receiving element, and a convex lens provided at the seal body. The infrared data communication module is provided with a cap for electromagnetic shielding, wherein the electromagnetic shield cap includes an engaging portion for engaging the lens in such a manner as to embrace the lens.

The infrared data communication module having such a structure has the same advantages as those described for the electromagnetic shield cap according to the fifth aspect of the present invention.

Other features and advantages of the present invention will become clearer from the description of embodiments given below with reference to the accompanying drawings.

BRIEF DESCRIPTION OF THE DRAWINGS

FIG. 1 is a plan view of an infrared data communication module on which an electromagnetic shield cap is mounted in accordance with a first aspect of the present invention.

FIG. 2 is a front view of the infrared data communication module shown in FIG. 1.

FIG. 16 is a right side view of the infrared data communication module shown in FIG. 12.

FIG. 17 is a left side view of the infrared data communication module shown in FIG. 12.

FIG. 18 is a plan view of the electromagnetic shield cap mounted on the infrared data communication module shown in FIG. 12.

BEST MODE FOR CARRYING OUT THE INVENTION

FIGS. 1 through 11 illustrate a first embodiment of the present invention.

Figure 3:
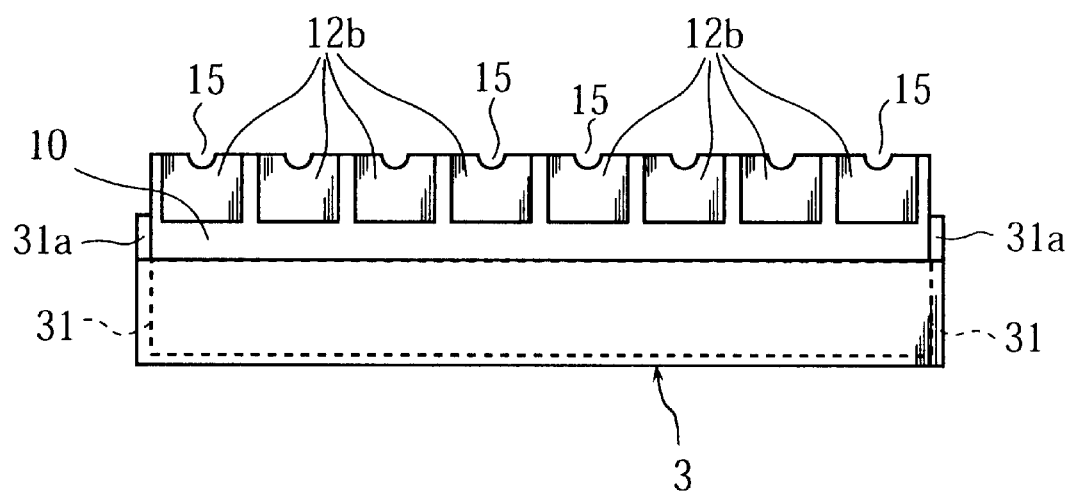
FIG. 3 is a bottom view of the infrared data communication module shown in FIG. 1.
Figure 4:
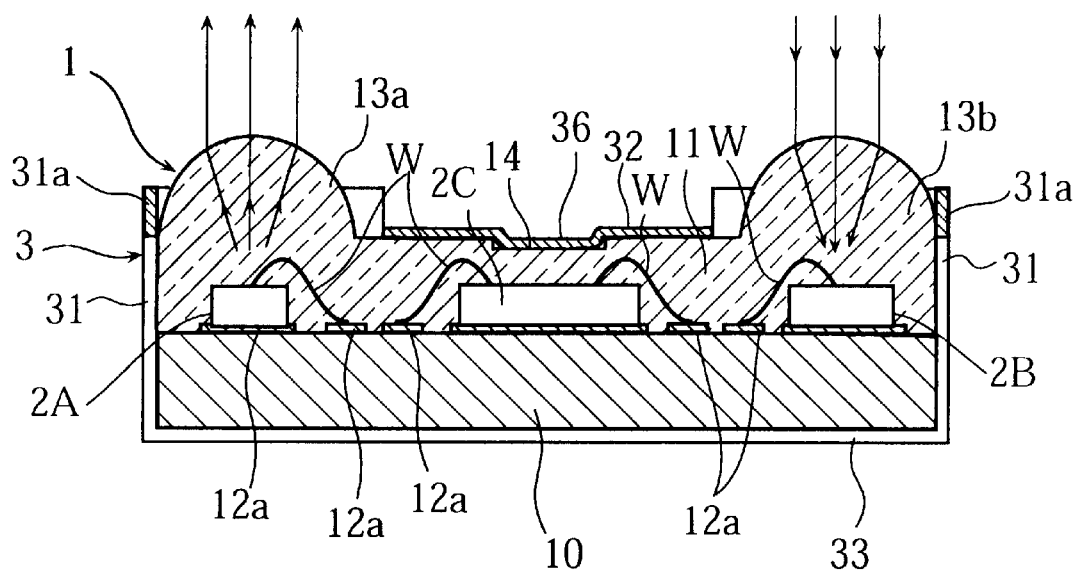
FIG. 4 is a sectional view taken along lines IV—IV in FIG. 1.

As clearly shown in FIG. 4, an infrared data communication module 1 in this embodiment includes a substrate 10. Mounted on the subtrate 10 are an infrared light emitting element 2A, an infrared light receiving element 2B and a control LSI chip 2C, and these components are sealed in a seal body 11 made of resin. An electromagnetic shield cap 3 is fitted over the infrared data communication module 1.

The substrate 10 is rectangular and may be formed of a glass-reinforced-epoxy resin for example. A wiring pattern is formed on an obverse surface, a reverse surface and a side surface of the substrate 10. The obverse surface of the substrate 10 is further provided with a plurality of pads 12a for electrical connection to corresponding electrodes of the light emitting element 2A, the light receiving element 2B and the LSI chip 2C. As clearly shown in FIGS. 3 and 5, the reverse surface of the substrate 10 is formed with a plurality of terminals 12b. The pads 12a are electrically connected to respective terminals 12b via a plurality of connecting portions 12c formed of a conductive film. The connecting portions 12c may be formed by the method which will be described later. Each of the connecting portions 12c is formed with a groove 15.

The infrared data communication module 1 may be mounted on a surface of a desired mother board in two different modes. In a first mode, the substrate 10 is disposed so that its reverse surface faces the mother board (not shown) to solder the terminals 12b onto the mother board. In this case, it is possible to apply solder also to the connecting portions 12c which are in rising posture from the mother board. According to the first mode, the infrared transmitting/receiving direction becomes substantially perpendicular to the surface of the mother board. In a second mode, the substrate is disposed so that the side surface formed with the connecting portions 12c faces the mother board to solder the connecting portions 12c onto the mother board. In this case, it is possible to apply solder also to the terminals 12b which are in rising posture from the mother board. According to the second mode, the infrared transmitting/receiving direction becomes substantially parallel to the surface of the mother board.

The light emitting element 2A may be a light emitting diode chip for example The light receiving element 2B may be a PIN photodiode chip for example. The LSI chip 2C performs drive control of the light emitting element 2A and the light receiving element 2B, and processes various kinds of signals.

The seal body 11 may be made of an epoxy resin containing a pigment for example, and may be formed on the substrate 10 by transfer molding. The seal body 11 has the property of blocking visible light while reliably passing infrared. Hemispherical lenses 13a, 13b are integrally formed on an upper surface of the seal body 11. The lenses 13a, 13b provide directivity for the light emitting element 2A and the light receiving element 2B. The upper surface of the seal body 11 is formed with a recess 14 between the lenses 13a and 13b. As will be described later, the recess 14 is impressed by an ejector pin used in molding the seal body 11.

The infrared data communication module 1 may be manufactured using a collective board. Specifically, to provide an infrared data communication module 1, a collective board having a size capable of providing a plurality of substrates 10 is prepared. Predetermined wiring patterns are formed on both an obverse and a reverse surfaces of the substrate, which are electrically connected via through-holes. Then, plural sets of components each including a light emitting element 2A, a light receiving element 2B and an LSI chip 2C are mounted on the collective board, and wires W are bonded at predetermined portions. Then, a seal body is formed of resin by transfer molding for sealing the above-described mounted parts. Thereafter, the collective board is divided into a plurality of substrates. By performing these steps, a plurality of infrared data communication modules 1 are efficiently made from a single collective board. A plurality of grooves 15 may be provided on the substrate 10 by cutting the collective board at portions formed with the through-holes.

In forming a seal body 11 by transfer molding, an ejector pin is set at an appropriate portion of the mold in advance so that the infrared data communication module 1 can be removed from the mold after resin is injected into the mold. However, it is difficult to set the ejector pin with its tip positioned precisely flush with a cavity-defining inner surface of the mold. Accordingly, the ejector pin is so set that the tip projects slightly from the inner surface of the mold. This is because, if the tip of the ejector pin retreats from the inner surface of the mold, a protrusion may be formed on a surface of the seal body 11 as a fin. For this reason, a recess 14 is formed on the seal body 11. The recess 14 may be generally circular and may have a depth of about 50 $\mu$m for example. It should be noted that the infrared data communication module maybe 7 mm long (in the lateral direction of FIGS. 1 through 4), 2 mm wide and 1.5 mm high for example.

The electromagnetic shield cap 3 may be formed by press-working a thin metal plate into a generally box-like configuration for fitting over the infrared data communication module 1 in the direction indicated by an arrow Na. The electromagnetic shield cap 3 has a rectangular main wall 30 for covering the rear surface of the infrared data communication module 1, a pair of side walls 31 respectively extending from the longitudinally opposite ends of the main wall 30 toward the front, an upper wall 32 extending from the upper edge of the main wall 30 toward the front, and a lower wall 33 extending from the lower edge of the main wall 30 toward the front.

The pair of side walls 31 for covering longitudinally opposite side surfaces of the infrared data communication module 1, respectively, are spaced in facing relationship with each other for interposing the infrared data communication module 1 therebetween. As clearly shown in FIG. 11, each of the side walls 31 is provided with a projection 34. The projection 34 is provided by forming a cut 35 on the side wall 31, and then bending the portion surrounded by the cut of the side wall 31 into the space between the paired side walls 31. The cut 35 may be generally in the form of an inverted U. However, the configuration of the cut 35 is not limitative and may be generally in the form of U or V for example. The projection 34 is inclined to be farther from the side wall 31 as it extends toward the main wall 30. As clearly shown in FIG. 9, when the electromagnetic shield cap 3 is mounted on the infrared data communication module 1, each projection 34 is pressed against the corresponding side surface of the seal body 11 with a suitable elastic force F. As clearly shown in FIGS. 7 and 8, each of the side walls 31 is upwardly formed with a projecting lip 31a which projects upward relative to the seal body 11 of the infrared data communication module 1. The projecting lip 31a is provided to increase the covered area of the infrared data communication module 1 for more effective shielding.

The upper wall 32 covers the upper surface of the seal body 11 between the paired lenses 13a and 13b. As clearly shown in FIG. 5, the upper wall 32 has a lower surface formed with a bulging portion 36 for fitting into the recess 14. The bulging portion 36 may be formed, for example, by press-working the upper wall 32. The bulging portion 36 is tapered with a hem 36a extending obliquely from a flat portion of the upper wall around the bulging portion 36a. Preferably, the inclination angle θ defined between the hem 36a and a perpendicular (normal) line L to the flat portion around the bulging portion 36a may be from 30° to 60°.

The upper wall 32 is formed with a bent segment 32a rising substantially vertically from an edge of the upper wall 32. The bent segment 32a becomes substantially flush with the side surface of the infrared data communication module 1 formed with the plurality of connecting portions 21c. Therefore, when the infrared data communication module 1 is mounted on a mother board with the side surface oriented downward, the bent segment 32a is disposed on the mother board in contact therewith. As a result, it is possible to apply solder also to the bent segment 32a, which enhances the strength of mounting of the infrared data communication module 1. The bent segment 32a may also serve as a grabbing tab in handling the electromagnetic shield cap 3. As clearly shown in FIG. 5, the lower wall 33 for covering the lower surface of the substrate 10 has a width which does not reach the terminals 12b.

Figure 5:
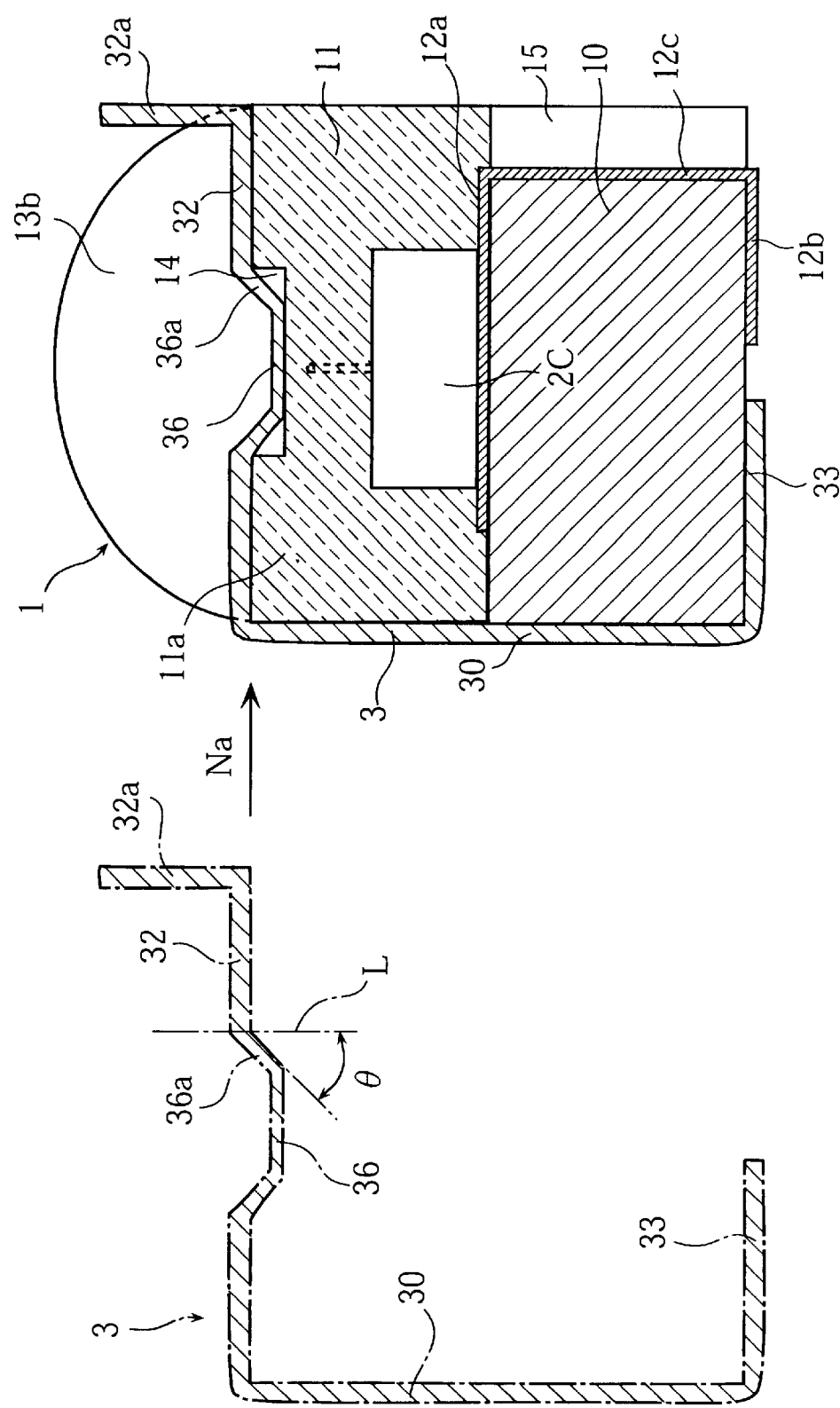
FIG. 5 is a sectional view taken along lines V—V in FIG. 1.
Figure 6:
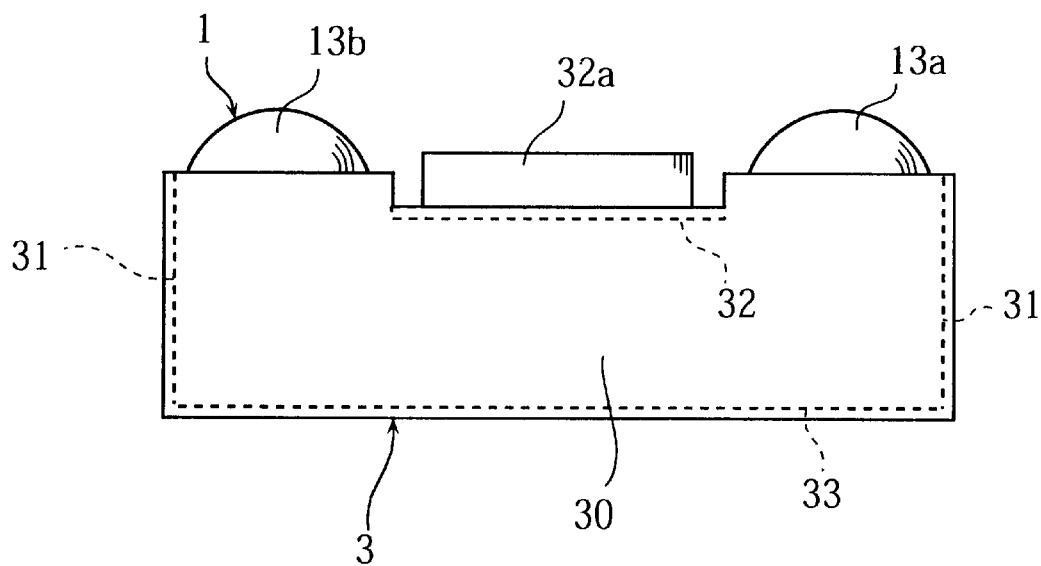
FIG. 6 is a rear view of the infrared data communication module shown in FIG. 1.
Figure 7:
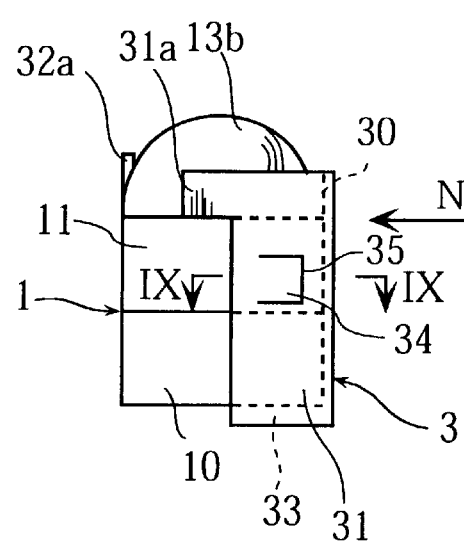
FIG. 7 is a right side view of the infrared data communication module shown in FIG. 1.
Figure 8:
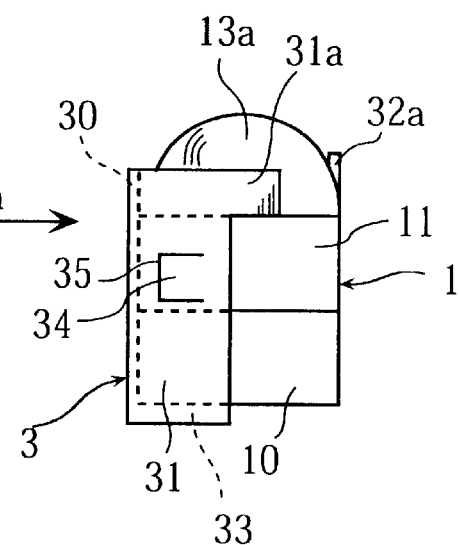
FIG. 8 is a left side view of the infrared data communication module shown in FIG. 1.

In mounting the electromagnetic shield cap 3 to the infrared data communication module 1, the bulging portion 36 of the electromagnetic shield cap 3, which is indicated by phantom lines in FIG. 5, comes into contact with an upper edge 11a of the seal body 11. At this time, since the hem 36a of the bulging portion 36 extends obliquely, it is possible to readily fit the electromagnetic shield cap 3 over the infrared data communication module 1 by sliding the hem 36a of the bulging potion 36 relative to the upper edge 11a while biasing the upper wall 32 upwardly. Therefore, the provision of the bulging portion 36 does not make it difficult to mount the electromagnetic shield cap 3 to the infrared data communication module 1. Moreover, the seal body 11 is prevented from cracking or breaking at the upper edge 11a. When the bulging portion 36 reaches above the recess 14, the bulging portion 36 fits into the recess 14 due to elastic restoration of the upper wall 32. Since the bulging portion 36 is tapered, it smoothly fits into the recess 14.

When the bulging portion 36 fits into the recess 14, the electromagnetic shield cap 3 is prevented from being detached from the infrared data communication module 1. Since an ejector pin used in molding the seal body 11 impresses the recess 14, the mold for forming the seal body 11 need not be formed with a projection for forming a recess 14. Therefore, it is possible to prevent an increase of the cost for the mold.

Figure 9:
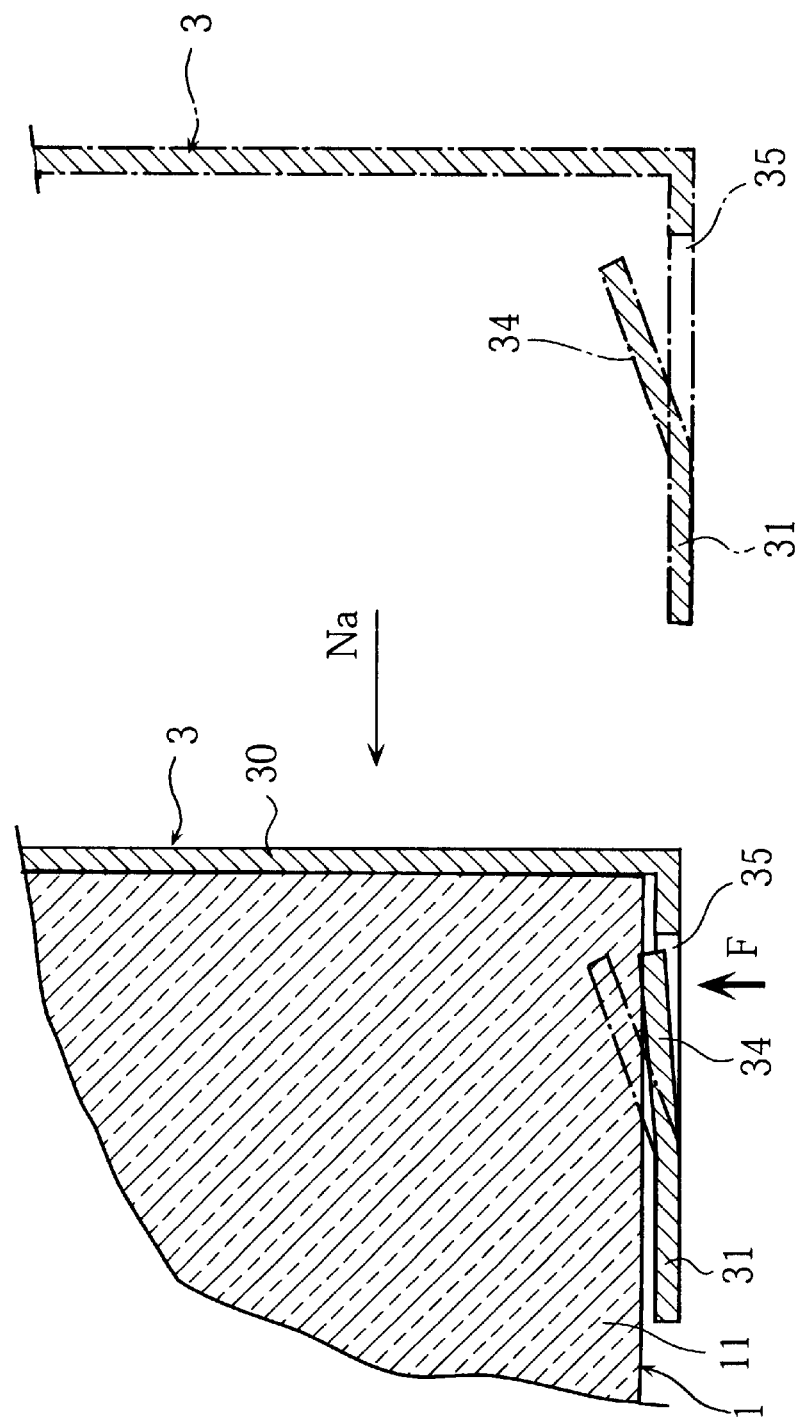
FIG. 9 is a sectional view taken along lines IX—IX in FIG. 7, showing a principal portion.
Figure 10:
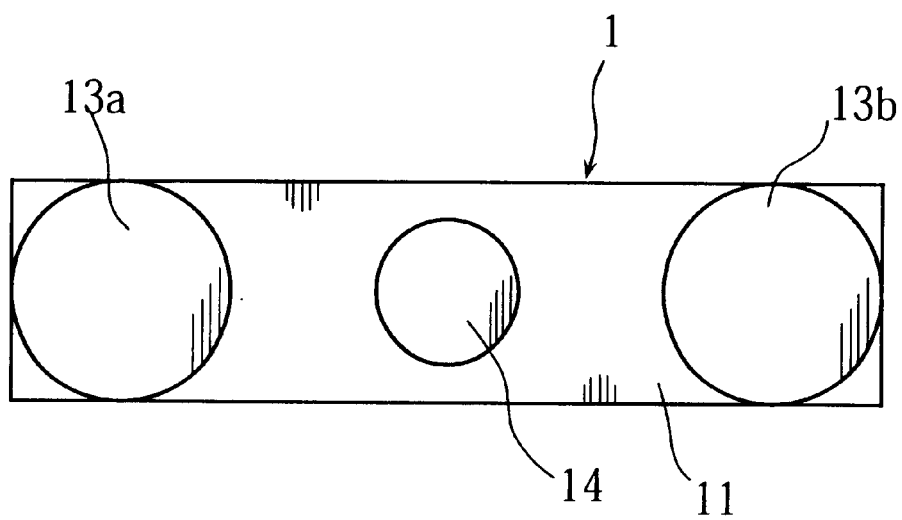
FIG. 10 is a plan view of the infrared data communication module with the electromagnetic shield cap removed.
Figure 11:
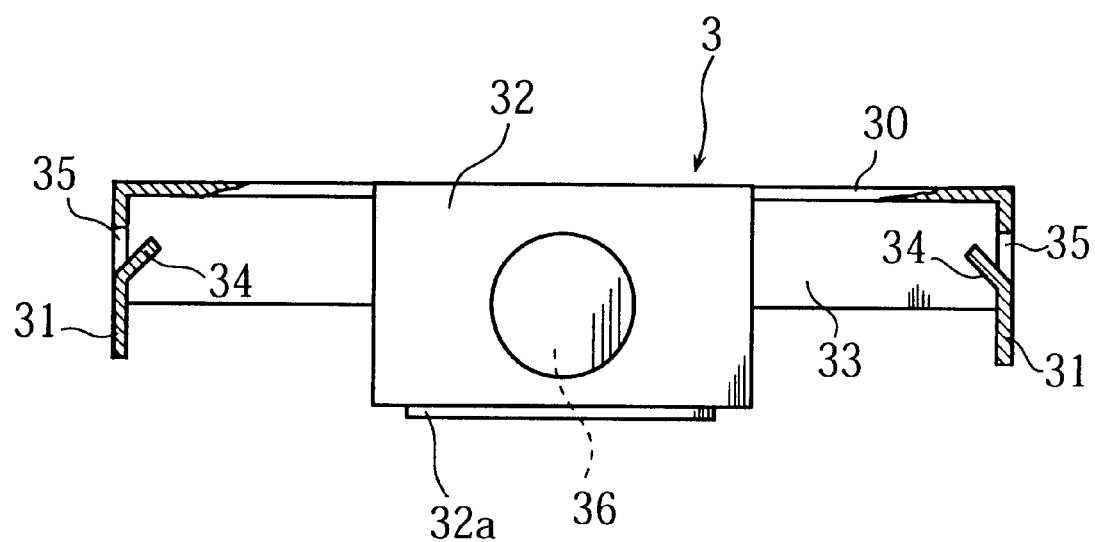
FIG. 11 is a plan view of the electromagnetic shield cap mounted on the infrared data communication module shown in FIG. 1.

In fitting the electromagnetic shield cap 3 over the infrared data communication module 1, the projection 34 formed on each side wall 31 is pressed against a corresponding side surface of the seal body 11 so as to reduce the degree of projection from the side wall 31, as will be understood from FIG. 9. Therefore, the projection 34 may not pose much hindrance in fitting the electromagnetic shield cap 3 over the infrared data communication module 1.

When the electromagnetic shield cap 3 is mounted on the infrared data communication module 1, the paired projections 34 are pressed against the side surfaces of the seal body 11, respectively, with a suitable elastic force F. Due to such a force, the electromagnetic shield cap 3 is more reliably prevented from coming off the infrared data communication module 1. The tip of each projection 34 which is in contact with a corresponding side surface of the seal body 11 is directed oppositely to the cap fitting direction (indicated by the arrow Na) relative to the infrared data communication module 1. Therefore, when a force is exerted on the electromagnetic shield cap 3 oppositely to the cap fitting direction, a large resistance (frictional resistance) is generated between the tip of the projection 34 and the side surface of the seal body 11. As a result, the electromagnetic shield cap 3 is more reliably prevented from being detached.

In this embodiment, the provision of the bulging portion 36 and the pair of projections 34 on the electromagnetic shield cap 3 prevents the electromagnetic shield cap 3 from easily coming off the infrared data communication module 1. Therefore, the electromagnetic shield cap 3 need not be adhesively bonded to the infrared data communication module 1, so that a step of applying an adhesive is not necessary. As a result, the cost for manufacturing the infrared data communication module 1 provided with the electromagnetic shield cap 3 can be reduced correspondingly. The electromagnetic shield cap 3 prevents the light emitting element 2A, the light receiving element 2B and the LSI chip 2C of the infrared data communication module 1 from malfunctioning due to external noises.

In the above-described first embodiment, both the bulging portion 36 and the pair of projections 34 are provided to more reliably prevent the electromagnetic shield cap 3 from coming off. However, the present invention is not limited to such a structure, and only one of these may be provided. The bulging portion 36 and the projections 34 may be provided is provided in any number. When there are a plurality of recesses 14 impressed by ejector pins, a plurality of bulging portions 36 may be provided. The electromagnetic shield cap 3 may be provided with a single projection 34. Further, the position at which the bulging portion 36 or each projection 34 is provided may be varied. The projection 34 may be provided so as to press against the substrate 10 of the infrared data communication module 1. A projection provided on the electromagnetic shield cap 3 for pressing against an electronic component may be formed by turning back an edge of an appropriate wall of the electromagnetic shield cap 3.

FIGS. 12 through 18 illustrate a second embodiment of the present invention. The elements which are identical or similar to those of the first embodiment are designated by the same reference signs as those used in the first embodiment.

An infrared data communication module 1 according to this embodiment has a structure similar to that of the infrared data communication module 1 according to the first embodiment. This embodiment differs from the first embodiment in that an electromagnetic shield cap 3A is provided with a pair of engaging portions 37 instead of the pair of projections 34 in the first embodiment.

Figure 12:
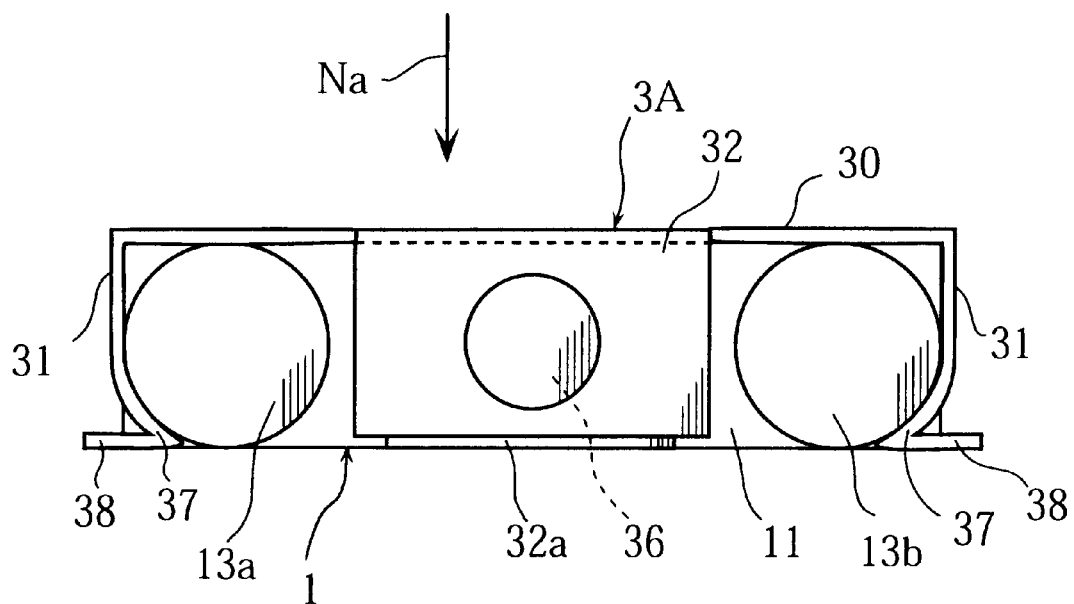
FIG. 12 is a plan view of an infrared data communication module on which an electromagnetic shield cap is mounted in accordance with a second embodiment of the present invention.
Figure 13:
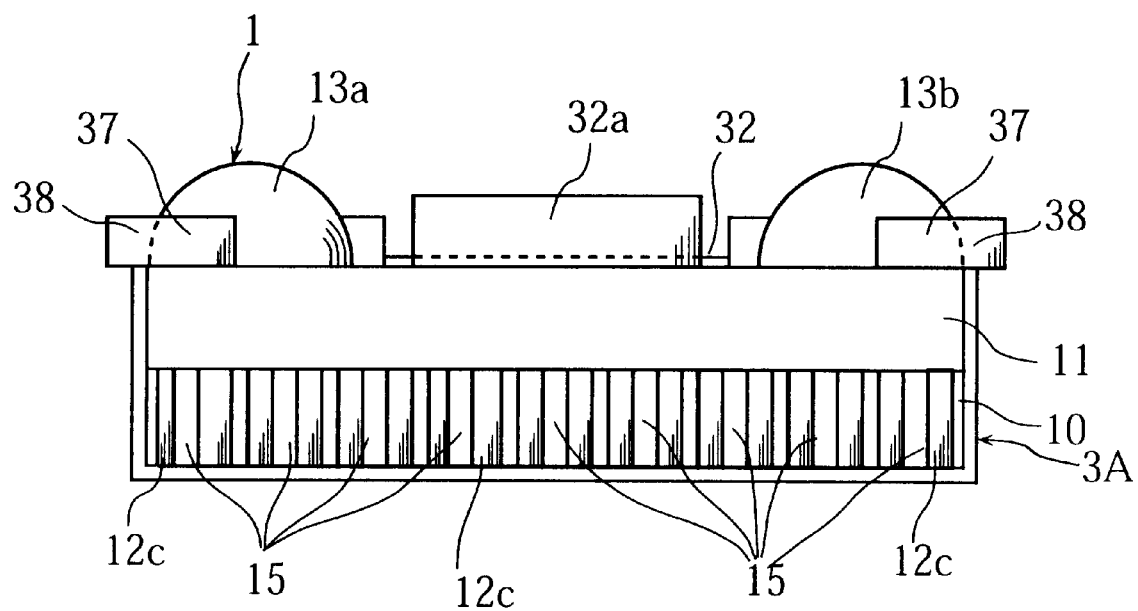
FIG. 13 is a front view of the infrared data communication module shown in FIG. 12.
Figure 14:
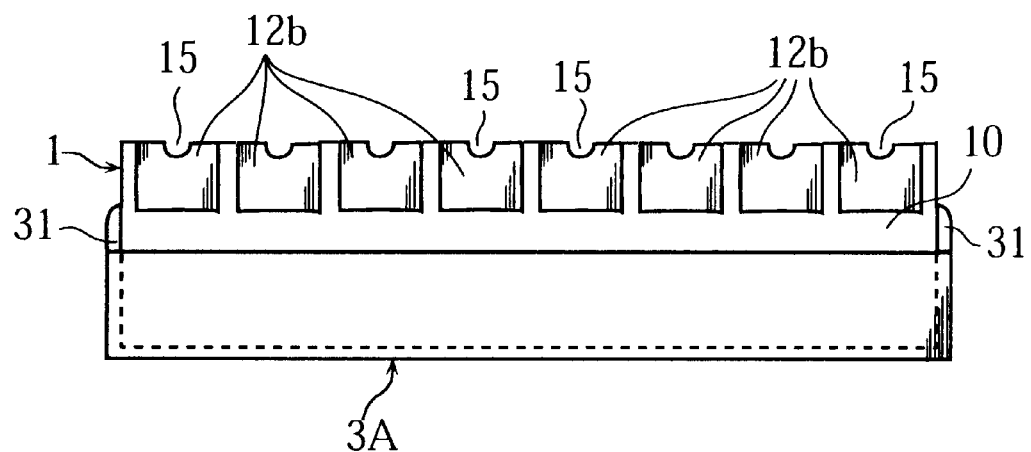
FIG. 14 is a bottom view of the infrared data communication module shown in FIG. 12.
Figure 15:
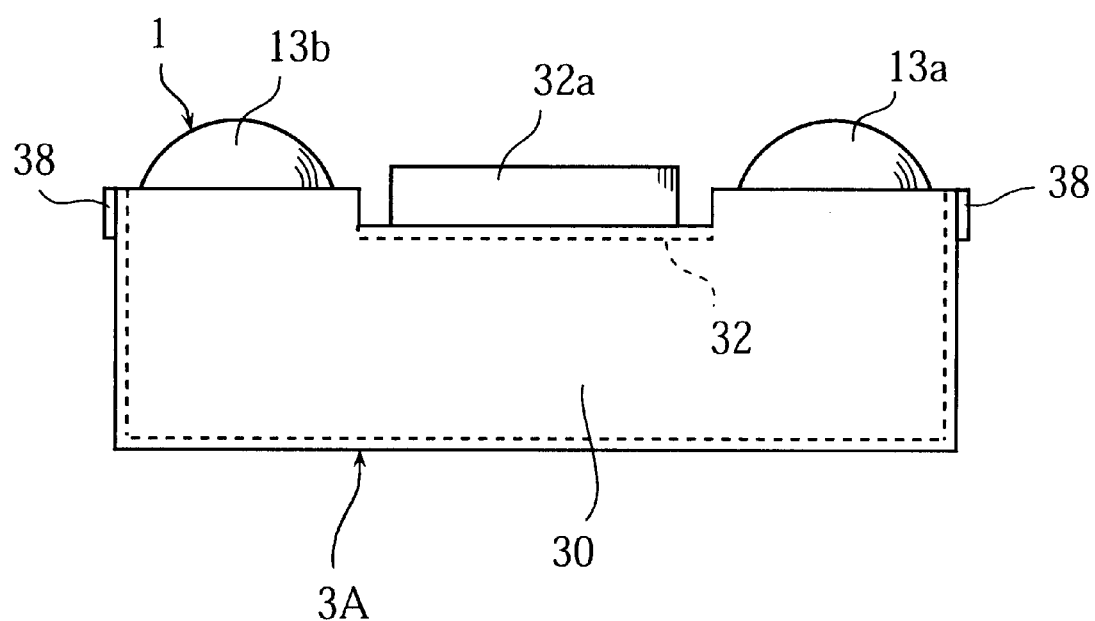
FIG. 15 is a rear view of the infrared data communication module shown in FIG. 12.

Specifically, each of the paired side walls 31 is upwardly provided with an engaging portion 37. The engaging portion 37 is formed by partially bending an upper portion of each side wall 31. As shown in FIGS. 12 and 13, when the electromagnetic shield cap 3A is mounted to the infrared data communication module 1, the engaging portion 37 engages the outer periphery of a base portion of the lens 13a or 13b in such a manner as to embrace the lens. Each engaging portion 37 is continuously formed with a turned-back portion 38 which turns back from the end of the engaging portion longitudinally outwardly of the electromagnetic shield cap 3. Each turned-back portion 38 has a front surface which is flush with the front surface of the bent segment 32a of the upper wall 32. Therefore, when the infrared data communication module 1 is mounted on a mother board in a manner such that the surface formed with the connecting portions 12c faces the mother board, both the bent segment 32a and the turned-back portions 38 are brought into contact with the mother board for soldering. The electromagnetic shield cap 3A is fitted over the infrared data communication module 1 in the direction indicated by the arrow Na. At this time, the pair of side walls 31 may be elastically deformed to widen the spacing between the pair of engaging portions 37 so that the engaging portions 37 do not hinder the insertion of the cap at the lenses 13a, 13b. After the electromagnetic shield cap 3A covers the infrared data communication module 1, the pair of side walls 3A are elastically restored for engagement with the lenses 13a, 13b in such a manner as to embrace the lenses. As a result, it is possible to prevent the electromagnetic shield cap 3A from being easily detached from the infrared data communication module 1. Since each engaging portion 37 engages the outer periphery of the base portion of a corresponding lens 13a or 13b, outer surfaces of the lenses 13a, 13b will not be entirely covered with the engaging portions 37.

Thus, also in this embodiment, the electromagnetic shield cap 3A can be prevented from being easily detached from the infrared data communication module 1 without using an adhesive. Therefore, a step for applying an adhesive is not necessary, and hence, the cost for manufacturing the infrared data communication module provided with the electromagnetic shield cap can be reduced correspondingly.

The present invention is not limited to the above-described embodiments, and the specific structure of the components may be modified in various ways.

For example, only a single engaging portion may be provided for engaging the lens. Alternatively, where no less than three lenses are provided for example, three engaging portions may be provided. The engaging portion need not necessarily be so smoothly curved as to conform to the outer periphery of the lens.

The electromagnetic shield cap has only to have a configuration suitable for being mounted to an electronic component to cover the component. The electromagnetic shield cap according to the present invention can be used not only for an infrared data communication module but also for other electronic components for electromagnetically shielding.

What is claimed is:

1. An electromagnetic shield cap to be mounted on an electronic component for electromagnetically shielding the electronic component, the electronic component including a semiconductor chip and a seal body made of resin for sealing the semiconductor chip, wherein the electromagnetic shield cap includes a projection for elastically pressing against the electronic component when the cap is mounted to the electronic component, wherein the electromagnetic shield cap has a wall for facing the electronic component, the projection being provided by forming a cut on the wall and partially bending the wall in a rising manner, wherein the cap is fitted to the electronic component from a front side to a back side of the cap, the projection being inclined to project to a greater degree as it extends from the front side toward the back side, and wherein the projection has a tip which is directed oppositely to the cap fitting direction.

2. The electromagnetic shield cap according to claim 1, wherein the electromagnetic shield cap has a pair of side walls spaced in facing relationship with each other for interposing the electronic component therebetween, the projection being provided on each of the side walls.

3. An infrared data communication module including a substrate, an infrared light emitting element mounted on the substrate, an infrared light receiving element mounted on the substrate, and a seal body made of resin for sealing the light emitting element and the light receiving element, the infrared data communication module being provided with a cap for electromagnetic shielding, wherein the electromagnetic shield cap is provided with a projection for elastically pressing against at least one of the substrate and the seal body with an elastic force, wherein the electromagnetic shield cap has a wall for facing said at least one of the substrate and the seal body, the projection being provided by forming a cut on the wall and partially bending the wall in a rising manner, wherein the cap is fitted to the electronic component from a front side to a back side of the cap, the projection being inclined to project to a greater degree as it extends from the front side toward the back side, and wherein the projection has a tip which is directed oppositely to the cap fitting direction.

4. An electromagnetic shield cap to be mounted on an electronic component for electromagnetically shielding the electronic component, the electronic component including a semiconductor chip and a seal body made of resin for sealing the semiconductor chip, the seal body being provided with a recess impressed by an ejector pin attached to a mold for molding the seal body, wherein the electromagnetic shield cap includes a bulging portion for fitting into the recess when the cap is mounted to the electronic component, wherein the electromagnetic shield cap has a wall for facing the seal body, wherein the bulging portion is tapered to have a hem extending obliquely from a flat portion around the bulging portion.

5. The electromagnetic shield cap according to claim 4, further comprising a projection for elastically pressing against the electronic component when the cap is mounted to the electronic component.

6. An infrared data communication module including an infrared light emitting element, an infrared light receiving element, and a seal body made of resin for sealing the light emitting element and the light receiving element, the seal body being formed with a recess, the infrared data communication module being provided with a cap for electromagnetic shielding, wherein the electromagnetic shield cap has a bulging portion for being fitted into the recess, wherein the electromagnetic shield cap has a wall for facing the seal body, wherein the bulging portion is tapered to have a hem extending obliquely from a flat portion around the bulging portion.

7. An electromagnetic shield cap to be mounted on an electronic component for electromagnetically shielding the electronic component, the electronic component including a semiconductor chip, a seal body made of resin for sealing the semiconductor chip, and a convex lens provided at the seal body, wherein the electromagnetic shield cap includes a main body for fitting over the seal body, the electromagnetic shield cap also including an engaging portion for embracing the lens while also exposing the lens when the cap is mounted to the electronic component.

8. The electromagnetic shield cap according to claim 7, wherein the engaging portion is so configured as to engage an outer periphery of a base portion of the lens.

9. An infrared data communication module including an infrared light emitting element, an infrared light receiving element, a seal body made of resin for sealing the light emitting element and the light receiving element, and a convex lens provided at the seal body, wherein the infrared data communication module is provided with a cap for electromagnetic shielding, and wherein the electromagnetic shield cap includes a main body for fitting over the seal body, the electromagnetic shield cap also including an engaging portion for embracing the lens while also exposing the lens.

10. An electromagnetic shield cap to be mounted on an electronic component for electromagnetically shielding the electronic component, the electromagnetic shield cap comprising:

a main wall having opposite ends, an upper edge and a lower edge;

a pair of side walls extending from the opposite ends of the main wall and spaced from each other;

an upper wall extending from the upper edge of the main wall between the side walls, the upper wall being spaced from the side walls; and a lower wall extending from the lower edge of the main wall between the side walls;

at least one of the side walls and the upper wall being provided with a projection for elastically pressing against the seal body when the cap is fitted over the electronic component.

11. An infrared data communication module comprising:

an infrared light emitting element;

an infrared light receiving element;

a control chip electrically connected to the light emitting element and the light receiving element;

a seal body made of resin for sealing and the control chip, the seal body having convex lenses corresponding to the light emitting element and the light receiving element; and an electromagnetic shield cap fitted over the seal body;

wherein the electromagnetic shield cap includes:

a main wall having opposite ends, an upper edge and a lower edge;

a pair of side walls extending from the opposite ends of the main wall and spaced from each other;

an upper wall extending from the upper edge of the main wall between the side walls for covering the control chip while being spaced from the side walls for exposing the lenses; and a lower wall extending from the lower edge of the main wall between the side walls;

at least one of the side walls and the upper wall being provided with a projection for elastically pressing against the seal body.

* * * * *